US009884768B2

(12) United States Patent
Zhong et al.

(10) Patent No.: US 9,884,768 B2
(45) Date of Patent: Feb. 6, 2018

(54) METHOD FOR MANUFACTURING VERTICALLY-GROWING OPEN CARBON NANOTUBE THIN FILM

(71) Applicant: NANJING TECH UNIVERSITY, Nanjing (CN)

(72) Inventors: Zhaoxiang Zhong, Nanjing (CN); Yang Zhao, Nanjing (CN); Zhong Yao, Nanjing (CN)

(73) Assignee: Nanjing Tech University, Nanjing (CN)

( * ) Notice: Subject to any disclaimer, the term of this patent is extended or adjusted under 35 U.S.C. 154(b) by 0 days.

(21) Appl. No.: 15/317,123

(22) PCT Filed: Jul. 20, 2015

(86) PCT No.: PCT/CN2015/084476
§ 371 (c)(1),
(2) Date: Dec. 8, 2016

(87) PCT Pub. No.: WO2016/173127
PCT Pub. Date: Nov. 3, 2016

(65) Prior Publication Data
US 2017/0113933 A1    Apr. 27, 2017

(30) Foreign Application Priority Data

Apr. 28, 2015 (CN) .......................... 2015 1 0209568

(51) Int. Cl.
*C01B 32/166* (2017.01)
*C01B 32/17* (2017.01)
(Continued)

(52) U.S. Cl.
CPC ............ *C01B 32/166* (2017.08); *B82Y 40/00* (2013.01); *C01B 32/17* (2017.08); *C01B 32/178* (2017.08);
(Continued)

(58) Field of Classification Search
CPC ..... C01B 32/166; C01B 32/17; C01B 32/178; C01B 2202/08; B82Y 30/00; B82Y 40/00;
(Continued)

(56) References Cited

U.S. PATENT DOCUMENTS 9,833,772 B2 *   12/2017  Cola ...................... B01J 23/745
2011/0220574 A1 *  9/2011  Bakajin ................ B01D 53/228
                                                              210/650
(Continued)

FOREIGN PATENT DOCUMENTS

CN      102161814 A      8/2011
CN      102263221 A      11/2011
CN      104311852 A      1/2015

OTHER PUBLICATIONS

CN 104311852 A, Jan. 28, 2015, English language abstract. (Year: 2015).*

(Continued)

*Primary Examiner* — Anita K Alanko
(74) *Attorney, Agent, or Firm* — Treasure IP Group, LLC

(57) ABSTRACT

Disclosed is a method for manufacturing a vertically-growing open carbon nanotube thin film. The method comprises: grinding the surface of a ceramic film by using metallographical sandpaper, performing ultrasonic cleaning by using acetone and performing boiling with water, and performing drying to obtain a ceramic film substrate; dissolving a catalyst ferrocene in a carbon source dimethylbenzene in an ultrasonic manner, and adding a carbon nanotube growth promoting agent thiophene to form a mixed solution; putting the ceramic film substrate in a tubular furnace reactor, introducing nitrogen, and slowly injecting the mixed solution at a constant speed to perform a high-temperature vapor deposition reaction; and further performing plasma etching and nitric acid reflux heating treatment to open closed ends
(Continued)

of carbon nanotubes, and removing catalyst particles on the carbon nanotube thin film to obtain the open carbon nanotube thin film that is highly vertically aligned.

10 Claims, 2 Drawing Sheets

(51) Int. Cl.
*C01B 32/178* (2017.01)
*B82Y 40/00* (2011.01)
*B81C 1/00* (2006.01)
*B82Y 30/00* (2011.01)

(52) U.S. Cl.
CPC ...... *B81C 1/00158* (2013.01); *B81C 1/00206* (2013.01); *B82Y 30/00* (2013.01); *C01B 2202/08* (2013.01); *H01J 2237/334* (2013.01); *Y10S 977/742* (2013.01); *Y10S 977/842* (2013.01)

(58) Field of Classification Search
CPC ............. B81C 1/00158; B81C 1/00206; Y10S 977/742; Y10S 977/842; H01J 2237/334
See application file for complete search history.

(56) References Cited

U.S. PATENT DOCUMENTS

| | | | | |
|---|---|---|---|---|
| 2012/0213918 A1* | 8/2012 | Song | ...................... | B82Y 30/00 427/113 |
| 2014/0321027 A1* | 10/2014 | Nguyen | ................. | H01G 11/04 361/502 |
| 2017/0014777 A1* | 1/2017 | Quan | .................... | B01D 69/08 |

OTHER PUBLICATIONS

CN 102161814 A, Aug. 24, 2011, English language abstract. (Year: 2011).*
CN 102263221 A, Nov. 30, 2011, English language abstract. (Year: 2011).*

* cited by examiner

METHOD FOR MANUFACTURING VERTICALLY-GROWING OPEN CARBON NANOTUBE THIN FILM

CROSS REFERENCE TO RELATED APPLICATION

This application is a National Phase application of, and claims priority to, PCT Application No. PCT/CN2015/084476, filed on Jul. 20, 2012 entitled "METHOD FOR MANUFACTURING VERTICALLY-GROWING OPEN CARBON NANOTUBE THIN FILM", which claims priority to Chinese Application No. 201510209568.9, filed on Apr. 28, 2015. Both the PCT Application and Chinese Application are incorporated herein by reference in their entireties.

BACKGROUND

Technical Field

The present invention relates to the field of carbon nanotube thin membrane preparation technologies, and specifically, relates to a method for preparing a highly vertically oriented carbon nanotube thin membrane provided with an opening.

Related Art

The carbon nanotube is a novel carbon structure that is not found until 1991; it is an ideal structure formed mainly based on $sp^2$ hybridization in carbon atoms and mixed with $sp^3$ hybridization. A carbon nanotube may be considered as a seamless and hollow tube body which is rolled up by sheet-like graphene. A structure of the carbon nanotube is a complete graphene gird. Therefore, theoretical strength of the carbon nanotube is close to strength of the carbon-carbon bond, and strength of the carbon nanotube is theoretically predicted to be about 100 times of that of steel, but a density is only ⅙ of that of steel. Moreover, the carbon nanotube has high damage resistant and distortion resistant capabilities, and therefore, the carbon nanotube is referred to as a super fiber. The carbon nanotube has an extremely large specific surface area which may be 1315 $m^2/g$ at maximum, and is also considered to be an ideal novel hydrogen storage material because of its excellent adsorption properties. When the carbon nanotube serves as a catalyst carrier, a rate for a substance to pass through is thousands of times of that of a common catalyst, so that a chemical reaction rate can be significantly changed. For gas storage and filling of the carbon nanotube, the top of the carbon nanotubes needs to be opened. Carbon nanotubes provided with opening may be filled with metal, oxides, and the like, so as to obtain other nano materials needed by people. Meanwhile, the carbon nanotubes provided with opening at the top portion are also very helpful for improving beam emission in the low-conductive electric field and for grafting functional macromolecules.

Carbon nanotubes gradually become a hot spot researched in the field of nano materials because of their features such as a large superficial area, good heat conductivity and electrical conductivity, high chemical stability, and high mechanical strength. However, carbon nanotubes are Nano materials, and have higher actual application value if the carbon nanotubes are made into macro bodies such as carbon nanotube thin membrane provided with opening. For the carbon nanotube thin membrane prepared in the prior art, most carbon nanotubes are disorderly arranged, and the ports are closed and contain catalyst impurities. As a result, the applications of the carbon nanotubes are greatly limited.

When the carbon nanotube array is etched by using argon-oxygen plasma, the top portion of the carbon nanotubes may be bombarded by using high energy of heavy ion argon, and oxygen plasma may serve as a bombarding ion and may also remove amorphous carbon and catalyst particles after argon bombardment. When carbon nanotubes grow into a membrane, carbon nanotubes interact with each other because of van der Waals force, and when the growth density reaches a particular value, the carbon nanotubes are forced to grow uniformly along a vertical direction to form a self-supporting membrane-like macro body because of the limitation of growing space. This type of highly consistent and vertically oriented carbon nanotube thin membranes provided with openings are consistent in direction and are orderly arranged, and each carbon nanotube has a good opening performance. Moreover, compared with carbon nanotube thin membranes which grow and are arranged disorderly, this type of carbon nanotube thin membranes further have a larger specific surface area, and higher electrical conduction and heat conduction capabilities. When this type of carbon nanotube thin membranes serve as heat conduction and electrical conduction and membrane filtering materials and catalyst carriers, mass transfer and heat transfer efficiency of the substances is also greatly improved. Therefore, preparing a highly vertically oriented and highly densified carbon nanotube thin membrane provided with opening is an effective way to improve actual application value of the carbon nanotubes.

SUMMARY OF THE INVENTION

A problem to be solved by the present invention is to provide a method for preparing a highly vertically oriented carbon nanotube thin membrane provided with opening that is simple in operation steps, is low in costs, and is practical.

The present invention is implemented by means of the following technical solutions:

A method for preparing a carbon nanotube thin membrane provided with opening and growing vertically includes the following steps:

(1) preprocessing a ceramic membrane: first performing surface polishing treatment on a sheet-like ceramic membrane by using metallographic sandpaper, then placing the polished ceramic membrane into acetone for ultrasonic cleaning, then placing the ceramic membrane into pure water to boil to further remove impurities and open the surface channels of the membrane, and finally drying by using an oven;

(2) weighing an appropriate amount of ferrocene and ultrasonically dissolving the ferrocene into dimethylbenzene, and adding an appropriate amount of thiophene, a carbon nanotube growth promoting agent, to form a mixed solution;

(3) placing the ceramic membrane obtained in step (1) into a quartz boat, slowly pushing the ceramic membrane from a nozzle of a quartz tube to a high-temperature region of a tube furnace reactor, tightening flange at two ends of the quartz tube for sealing, and heating to a reaction temperature after nitrogen is filled in;

(4) slowly injecting the mixed solution prepared in step (2) into the tube furnace reactor at a uniform velocity by using an injector;

(5) stop heating after an isothermal reaction, naturally lowering a temperature under the protection of the nitrogen, turning off the nitrogen and a power source of the tube furnace reactor, and taking out the carbon nanotube thin membrane;

(6) placing the foregoing carbon nanotube thin membrane into a reaction chamber of a plasma etching machine, de-gassing the interior of the reaction chamber, then filling in high purity argon to increase air pressure within the chamber, then filling in high purity oxygen to make pressure within the reaction chamber be 2 times of original pressure, and turning on a power source of a plate electrode to perform plasma etching;

(7) placing the etched carbon nanotube thin membrane into a three-necked flask, turning on cooling water, adding a nitric acid solution of a particular concentration to the three-necked flask, heating and refluxing, then placing the carbon nanotube thin membrane in deionized water to be rinsed repeatedly till the pH of a water solution is 7, and finally placing the carbon nanotube thin membrane in the oven to be dried.

In step (1), the sheet-like ceramic membrane is an alumina ceramic membrane, a membrane pore size is 0.01-0.25 μm and a membrane thickness is 3-5 mm; ultrasonic power is 100-300 W; the metallographic sandpaper has 2500-3000 meshes; a time for ultrasonic cleaning in the acetone is 10-30 min; a time for boiling in the pure water is 30-60 min; a temperature of the oven is 60-70° C.; and a time for drying is 10-12 h.

In step (2), the ferrocene is analytically pure and is weighed by 1-3 g; the dimethylbenzene is analytically pure and is measured by 50-60 mL; the thiophene is analytically pure, and an addition amount is 10-15 μL; and ultrasonic power is 100-300 W.

In step (3), the tube furnace is a single-temperature tube furnace; the nitrogen is high purity nitrogen, and a nitrogen flow rate is 10-15 mL/s; and the reaction temperature is 600-900° C.

In step (4), the solution of 20-30 mL is injected, and an injection speed is about 0.3-0.4 mL/min.

In step (5), a time for the isothermal reaction is 1-2 h; and a nitrogen flow rate is 10-15 mL/s.

In step (6), the interior of the reaction chamber is de-gassed to a vacuum level of $4\text{-}5\times10^{-4}$ Pa; the air pressure within the chamber is increased to 10-12 Pa by filling in the high purity argon; the etching is direct current glow argon-oxygen plasma etching; a voltage is adjusted to 600-900V; a current is 20-60 mA; and the plasma etching is performed for 30 s to 3 min.

In step (7), the concentration of the nitric acid solution is 1-4 mol/L; a heating and refluxing time is 1-3 h; a heating and refluxing temperature is 50-65° C.; and a condition for drying in the oven is drying for at least 24 h at a temperature of 60-70° C.

Beneficial effects of the present invention are as follows:

The present invention provides a method for preparing a carbon nanotube thin membrane growing vertically. The method is simple and practical in process and is low in costs, and can achieve control on a density and a form of the carbon nanotube thin membrane by changing conditional parameters. The prepared carbon nanotube thin membrane may be widely applied to fields of gas purification and storage, electrical conduction and heat conduction, and catalyst carriers, and has a good application prospect.

DETAILED DESCRIPTION

Figure 1:
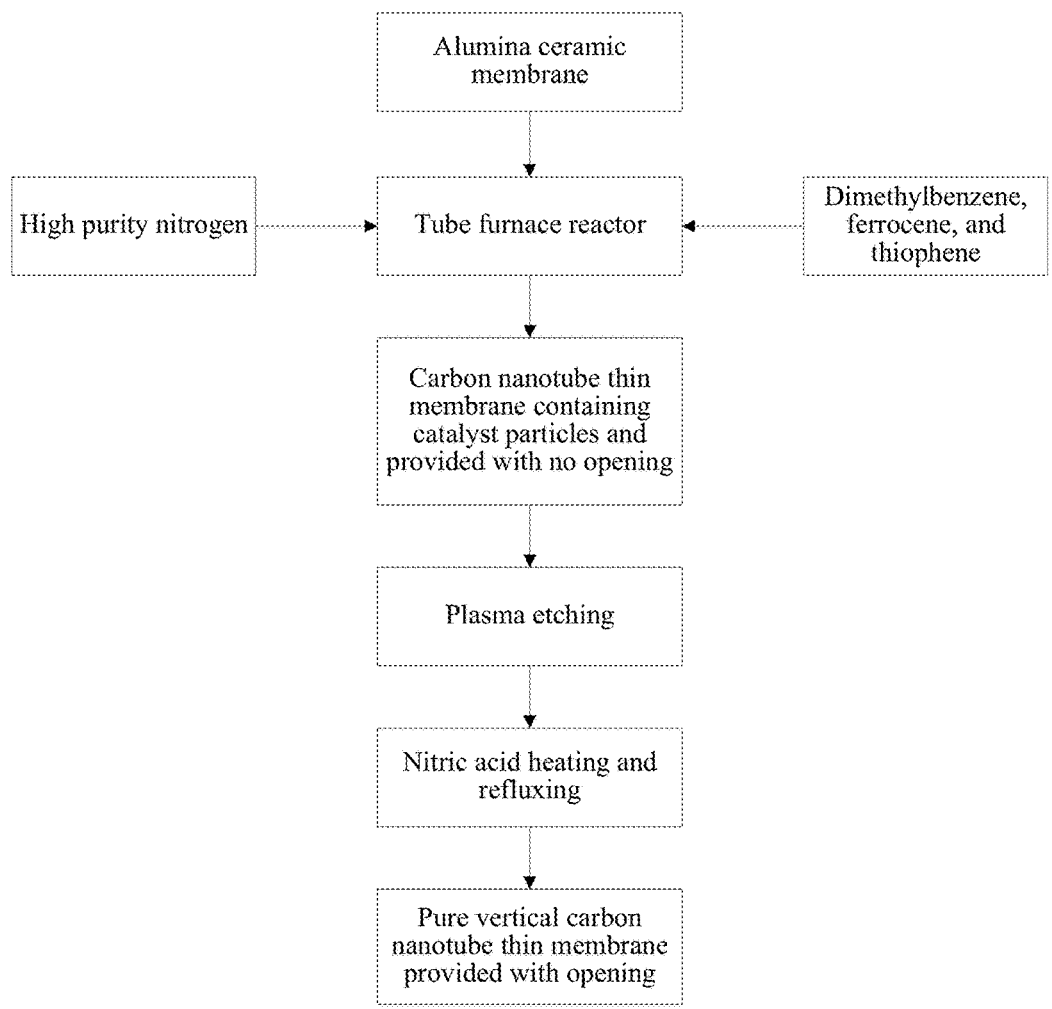
FIG. 1 is a flowchart of a preparation process of the present invention.
Figure 2:
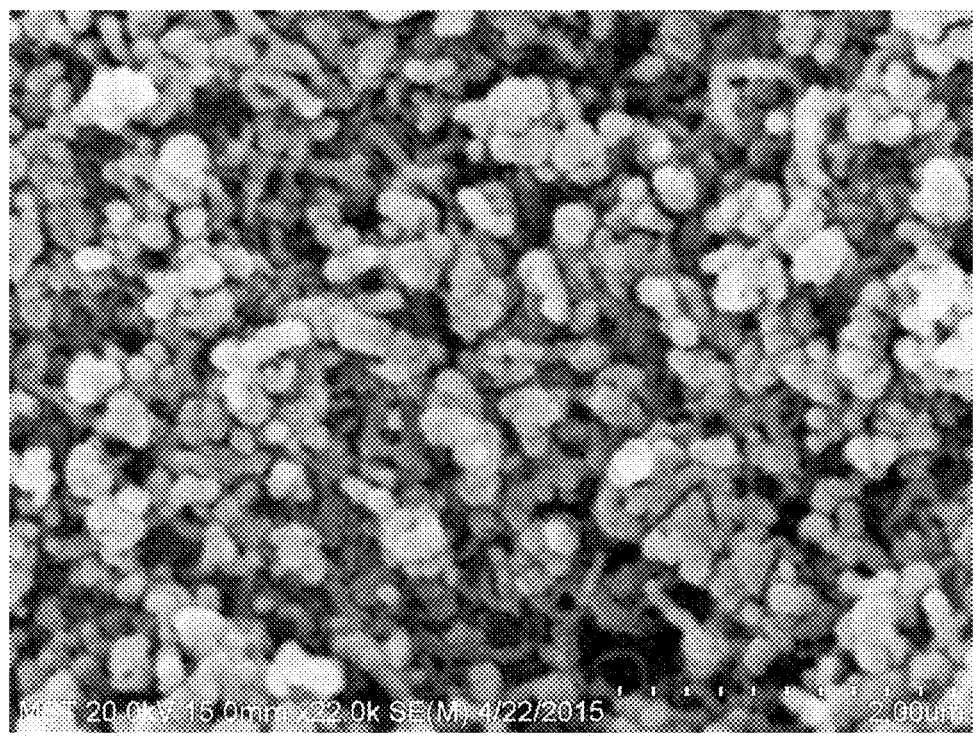
FIG. 2 is a scanning electron micrograph of the surface of the carbon nanotubes.
Figure 3:
FIG. 3 is a scanning electron micrograph of the profile for carbon nanotubes.

The present invention is further explained below with reference to the embodiments. The following embodiments are merely used for describing the present invention, and not are used to limit the implementation scope of the present invention.

Embodiment 1

First, metallographic sandpaper of 2500 meshes is used to perform surface polishing treatment on a sheet-like ceramic membrane with a membrane pore size of 0.01 μm and thickness of 3 mm; then the polished ceramic membrane is placed into acetone for ultrasonic cleaning for 10 min at power of 100 W; then the foregoing ceramic membrane is placed into pure water to boil for 30 min to further remove impurities and open the surface channels of the membrane; and finally the ceramic membrane is dried for 10 h at a temperature of 60° C. by using an oven for further use. Ferrocene of 1 g is weighed and ultrasonically dissolved into dimethylbenzene of 50 mL at power of 100 W, and thiophene, a carbon nanotube growth promoting agent, of 10 μL is added to form a mixed solution. The foregoing standby ceramic membrane is placed into a quartz boat and placed at a nozzle of a quartz tube, and is slowly pushed to a high-temperature region of a tube furnace, flanges at two ends of the quartz tube are tightened for sealing, nitrogen is filled in at a flow rate of 10 mL/s, and a temperature is increased to 600° C. The foregoing prepared mixed solution, of 20 mL, composed of the ferrocene, the dimethylbenzene, and the thiophene is slowly injected into a reaction furnace at a uniform velocity by using an injector, where an injection speed is about 0.3 mL/min. An isothermal reaction is performed for 1 h, and then the temperature is naturally cooled under the protection of the nitrogen at a flow rate of 10 mL/s. The nitrogen and a power source of the tube furnace are turned off, and flange seals are opened to take out the carbon nanotube thin membrane. The foregoing carbon nanotube thin membrane is placed into a reaction chamber of a plasma etching machine, the interior of the reaction chamber is first de-gassed to a vacuum level of $4\times10^{-4}$ Pa, and then a bleed air rate is turned down to an appropriate value to enable a gas to flow within the reaction chamber. An intake valve is opened to fill in high purity argon to increase air pressure within the chamber to 10 Pa, and then high purity oxygen is turned on to make pressure within the reaction chamber be 2 times of original pressure. A power source of a plate electrode is turned on to perform plasma etching for 30 s, where a voltage is adjusted to 600V, and a current is 20 mA. The etched carbon nanotube thin membrane is placed into a three-necked flask, cooling water is turned on, a nitric acid solution of 1 mol/L is added into the three-necked flask, and heating and refluxing are performed for 1 h at a temperature of 50° C.; and then the carbon nanotube thin membrane is placed in deionized water to be rinsed repeatedly till the pH of a water solution is 7, and finally the carbon nanotube thin membrane is placed in the oven to be dried for 24 h at a temperature of 60° C. Through the characterizations of scanning electron microscope and Raman spectrum, it is obtained that a surface of an alumina ceramic membrane is attached with a layer of vertically growing carbon nanotube array. Calibers of carbon nanotubes are relatively uniform, and a tube length is about 20 μm. The carbon nanotubes are well vertically oriented, and a single carbon nanotube is crimped. The carbon nanotube thin membrane is ordinary in compactness. An end portion of each carbon nanotube is often provided with an opening. Strong peaks occur at positions of 1580 $cm^{-1}$ and 1355 $cm^{-1}$ in the Raman spectrum, which indicates that the prepared carbon nanotubes are multi-walled carbon nanotubes.

Embodiment 2

First, metallographic sandpaper of 2500 meshes is used to perform surface polishing treatment on a sheet-like ceramic membrane with a membrane pore size of 0.1 μm and a thickness of 4 mm; then the polished ceramic membrane is placed into acetone for ultrasonic cleaning for 20 min at power of 200 W; then the foregoing ceramic membrane is placed into pure water to boil for 40 min to further remove impurities and open the surface channels of the membrane; and the ceramic membrane is dried for 10 h at a temperature of 65° C. by using an oven for further use. Ferrocene of 2 g is weighed and ultrasonically dissolved into dimethylbenzene of 55 mL at power of 200 W, and thiophene, a carbon nanotube growth promoting agent, 12 μL is added to form a mixed solution. The foregoing standby ceramic membrane is placed into a quartz boat and placed at a nozzle of a quartz tube, and is slowly pushed to a high-temperature region of a tube furnace, flanges at two ends of the quartz tube are tightened for sealing, nitrogen is filled in at a flow rate of 12 mL/s, and a temperature is increased to 700° C.; The foregoing prepared mixed solution, of 25 mL, composed of the ferrocene, the dimethylbenzene, and the thiophene is slowly injected into a reaction furnace at a uniform velocity by using an injector, where an injection speed is about 0.3 mL/min. An isothermal reaction is performed for 1.5 h, and then the temperature is naturally cooled under the protection of the nitrogen at a flow rate of 12 mL/s. The nitrogen and a power source of the tube furnace are turned off, and flange seals are opened to take out a carbon nanotube thin membrane. The foregoing carbon nanotube thin membrane is placed into a reaction chamber of a plasma etching machine, the interior of the reaction chamber is first de-gassed to a vacuum level of $5\times10^{-4}$ Pa, and then a bleed air rate is turned down to an appropriate value to enable a gas to flow within the reaction chamber. An intake valve is opened to fill in high purity argon to increase air pressure within the chamber to 11 Pa, and then high purity oxygen is turned on to make pressure within the reaction chamber be 2 times of original pressure. A power source of a plate electrode is turned on to perform plasma etching for 60 s, where a voltage is adjusted to 700V, and a current is 40 mA. The etched carbon nanotube thin membrane is placed into a three-necked flask, cooling water is turned on, a nitric acid solution of 2 mol/L is added into the three-necked flask, and heating and refluxing are performed for 1.5 h at a temperature of 55° C.; and then the carbon nanotube thin membrane is placed in deionized water to be rinsed repeatedly till the pH of a water solution is 7, and finally the carbon nanotube thin membrane is placed in the oven to be dried for 24 h at a temperature of 65° C. Through the characterizations of scanning electron microscope and Raman spectrum, it is obtained that a surface of an alumina ceramic membrane is attached with a layer of vertically growing carbon nanotube array. There is no catalyst particle on the top of the carbon nanotubes, and the carbon nanotubes are well vertically oriented. The carbon nanotube thin membrane is much dense, and a top portion of each carbon nanotube is provided with an opening. Calibers of the carbon nanotubes are uniform, a tube length is about 20 μm, and a tube body is a hollow body. Strong peaks occur at positions of 1580 $cm^{-1}$ and 1355 $cm^{-1}$ in the Raman spectrum, which indicates that the prepared carbon nanotubes are multi-walled carbon nanotubes.

Embodiment 3

First, metallographic sandpaper of 3000 meshes is used to perform surface polishing treatment on a sheet-like ceramic membrane with a membrane pore size of 0.2 μm and a thickness of 5 mm; then the polished ceramic membrane is placed into acetone for ultrasonic cleaning for 25 min at power of 300 W; then the foregoing ceramic membrane is placed into pure water to boil for 50 min to further remove impurities and open the surface channels of the membrane; and finally the ceramic membrane is dried for 12 h at a temperature of 70° C. by using an oven for further use. Ferrocene of 3 g is weighed and ultrasonically dissolved into dimethylbenzene of 60 mL at power of 250 W, and thiophene, a carbon nanotube growth promoting agent, of 13 μL is added to form a mixed solution. The foregoing standby ceramic membrane is placed into a quartz boat and placed at a nozzle of a quartz tube, and is slowly pushed to a high-temperature region of a tube furnace, flanges at two ends of the quartz tube are tightened for sealing, nitrogen is filed in at a flow rate of 13 mL/s, and a temperature is increased to 800° C. The foregoing prepared mixed solution, of 25 mL, composed of the ferrocene, the dimethylbenzene, and the thiophene is slowly injected into a reaction furnace at a uniform velocity by using an injector, where an injection speed is about 0.4 mL/min. An isothermal reaction is performed for 1.5 h, and then the temperature is naturally cooled under the protection of the nitrogen at a flow rate of 13 mL/s. The nitrogen and a power source of the tube furnace are turned off, and flange seals are opened to take out the carbon nanotube thin membrane. The foregoing carbon nanotube thin membrane is placed into a reaction chamber of a plasma etching machine, the interior of the reaction chamber is first de-gassed to a vacuum level of $5\times10^{-4}$ Pa, and then a bleed air rate is turned down to an appropriate value to enable a gas to flow within the reaction chamber. An intake valve is opened to fill in high purity argon to increase air pressure within the chamber to 11 Pa, and then high purity oxygen is turned on to make pressure within the reaction chamber be 2 times of original pressure. A power source of a plate electrode is turned on to perform plasma etching for 2 min, where a voltage is adjusted to 800V, and a current is 50 mA. The etched carbon nanotube thin membrane is placed into a three-necked flask, cooling water is turned on, a nitric acid solution of 3 mol/L is added into the three-necked flask, and heating and refluxing are performed for 2 h at a temperature of 65° C.; and then the carbon nanotube thin membrane is placed in deionized water to be rinsed repeatedly till the pH of a water solution is 7, and finally the carbon nanotube thin membrane is placed in the oven to be dried for 36 h at a temperature of 65° C. Through the characterizations of scanning electron microscope and Raman spectrum, it is obtained that a surface of an alumina ceramic membrane is attached with a layer of vertically growing carbon nanotube arrays. Strong peaks occur at positions of 1580 $cm^{-1}$ and 1355 $cm^{-1}$ in the Raman spectrum, which indicates that the carbon nanotubes are multi-walled carbon nanotubes. The prepared carbon nanotubes have a low defect level, and a tube length is about 18 μm. A carbon nanotube thin membrane is very dense. The tube body of each carbon nanotube is hollow. The top portion of carbon nanotubes is provided with opening, there are no catalyst particles, and the carbon nanotubes are consistent in a vertical orientation.

Embodiment 4

First, metallographic sandpaper of 3000 meshes is used to perform surface polishing treatment on a sheet-like ceramic membrane with a membrane pore size of 0.25 μm and a thickness of 5 mm; then the polished ceramic membrane is placed into acetone for ultrasonic cleaning for 30 min at power of 300 W; then the foregoing ceramic membrane is placed into pure water to boil for 60 min to further remove impurities and open the surface channels of the membrane; and finally the ceramic membrane is dried for 12 h at a temperature of 70° C. by using an oven for further use. Ferrocene of 3 g is weighed and ultrasonically dissolved into dimethylbenzene of 60 mL at power of 300 W, and thiophene, a carbon nanotube growth promoting agent, of 15 μL is added to form a mixed solution. The foregoing standby ceramic membrane is placed into a quartz boat and placed at a nozzle of a quartz tube, and is slowly pushed to a high-temperature region of a tube furnace, flanges at two ends of the quartz tube are tightened for sealing, nitrogen is filled in at a flow rate of 15 mL/s, and a temperature is increased to 900° C. The foregoing prepared mixed solution, of 30 mL, composed of the ferrocene, the dimethylbenzene, and the thiophene is slowly injected into a reaction furnace at a uniform velocity by using an injector, where an injection speed is about 0.4 mL/min. An isothermal reaction is performed for 2 h, and then the temperature is naturally cooled under the protection of the nitrogen at a flow rate of 15 mL/s. The nitrogen and a power source of the tube furnace are turned off, and flange seals are opened to take out the carbon nanotube thin membrane. The foregoing carbon nanotube thin membrane is placed into a reaction chamber of a plasma etching machine, the interior of the reaction chamber is first de-gassed to a vacuum level of $4 \times 10^{-4}$ Pa, and then a bleed air rate is turned down to an appropriate value to enable a gas to flow within the reaction chamber. An intake valve is opened to fill in high purity argon to increase air pressure within the chamber to 12 Pa, and then high purity oxygen is turned on to make pressure within the reaction chamber be 2 times of original pressure. A power source of a plate electrode is turned on to perform plasma etching for 3 min, where a voltage is adjusted to 900V, and a current is 60 mA. The etched carbon nanotube thin membrane is placed into a three-necked flask, cooling water is turned on, a nitric acid solution of 4 mol/L is added into the three-necked flask, and heating and refluxing are performed for 3 h at a temperature of 65° C.; and then the carbon nanotube thin membrane is placed in deionized water to be rinsed repeatedly till the pH of a water solution is 7, and finally the carbon nanotube thin membrane is placed in the oven to be dried for 30 h at a temperature of 70° C. Through the characterizations of scanning electron microscope and Raman spectrum, it is obtained that a surface of an alumina ceramic membrane is attached with a layer of vertically growing carbon nanotube array. Strong peaks occur at positions of 1580 $cm^{-1}$ and 1355 $cm^{-1}$ in the Raman spectrum, which indicates that the prepared carbon nanotubes are multi-walled carbon nanotubes. The carbon nanotube thin membrane is ordinary in compactness but is well vertically oriented. A single carbon nanotube is slightly crimped and inclined upwards, and the tube length of each carbon nanotube is about 18 The top portion is provided with an opening, and there is no catalyst particle.

What is claimed is:

1. A method for preparing a carbon nanotube thin membrane, provided with carbon nanotubes having an opening and vertically aligned comprising the following steps:
    (1) preprocessing a ceramic membrane: first performing surface polishing treatment on a sheet ceramic membrane by using metallographic sandpaper, then placing the polished ceramic membrane into acetone for ultrasonic cleaning, then placing the ceramic membrane into pure water to boil to further remove impurities and open the surface channels of the membrane, and finally drying by using an oven;
    (2) weighing an appropriate amount of ferrocene and ultrasonically dissolving the ferrocene into dimethylbenzene, and adding an amount of thiophene, a carbon nanotube growth promoting agent, to form a mixed solution;
    (3) placing the ceramic membrane obtained in step (1) into a quartz boat, pushing the ceramic membrane from a nozzle of a quartz tube to a high-temperature region of a tube furnace reactor, tightening flanges at two ends of the quartz tube for sealing, and starting procedural heating to a reaction temperature after nitrogen is filled in;
    (4) slowly injecting the mixed solution prepared in step (2) into the tube furnace reactor at a uniform velocity by using an injector and performing an isothermal reaction;
    (5) stopping heating after the isothermal reaction, naturally lowering the temperature under the protection of nitrogen, turning off the nitrogen and the power source of the tube furnace reactor, and taking out a carbon nanotube thin membrane;
    (6) placing the foregoing carbon nanotube thin membrane into a reaction chamber of a plasma etching machine, degassing the interior of the reaction chamber, then filling in argon to increase air pressure within the chamber, then filling in oxygen to make pressure within the reaction chamber be 2 times of original pressure, and turning on a power source of a plate electrode to perform plasma etching;
    (7) placing the etched carbon nanotube thin membrane into a three-necked flask, turning on cooling water, adding a nitric acid solution of a particular concentration to the three-necked flask, heating and refluxing, then placing the carbon nanotube thin membrane in deionized water to be rinsed repeatedly until the pH of a water solution is 7, and finally placing the carbon nanotube thin membrane in the oven to be dried.

2. The method for preparing a carbon nanotube thin membrane provided with opening and growing vertically according to claim 1, wherein in step (1), the sheet ceramic membrane is an alumina ceramic membrane, a membrane pore size is 0.01-0.25 μm, and a membrane thickness is 3-5 mm; and the metallographic sandpaper has 2500-3000 meshes.

3. The method for preparing a carbon nanotube thin membrane provided with opening and growing vertically according to claim 1, wherein in step (1), ultrasonic power is 100-300 W; a time for ultrasonic cleaning in the acetone is 10-30 min; time for boiling in the pure water is 30-60 min; a temperature of the oven is 60-70° C.; and a time for drying is 10-12 h.

4. The method for preparing a carbon nanotube thin membrane provided with opening and growing vertically according to claim 1, wherein in step (2), the ferrocene is pure and is weighed by 1-3 g; the dimethylbenzene is pure and is measured by 50-60 mL; the thiophene is pure, and an addition amount is 10-15 μL; and ultrasonic power is 100-300 W.

5. The method for preparing a carbon nanotube thin membrane provided with opening and growing vertically according to claim 1, wherein in step (3), the tube furnace is a single-temperature tube furnace; a nitrogen flow rate is 10-15 mL/s; a time for the procedural heating is 10-25 min; and the reaction temperature is 600-900° C.

6. The method for preparing a carbon nanotube thin membrane provided with opening and growing vertically according to claim 1, wherein in step (4), the solution of 20-30 mL is injected, and an injection speed is about 0.3-0.4 mL/min.

7. The method for preparing a carbon nanotube thin membrane provided with opening and growing vertically according to claim 1, wherein in step (5), a time for the isothermal reaction is 1-2 h; and a nitrogen flow rate is 10-15 mL/s.

8. The method for preparing a carbon nanotube thin membrane provided with opening and growing vertically according to claim 1, wherein in step (6), the interior of the reaction chamber is degassed to a vacuum level of $4\text{-}5\times10^{-4}$ Pa; and the air pressure within the chamber is increased to 10-12 Pa by filling in the argon.

9. The method for preparing a carbon nanotube thin membrane provided with opening and growing vertically according to claim 1, wherein in step (6), the etching is direct current glow argon-oxygen plasma etching; a voltage is adjusted to 600-900V; a current is 20-60 mA; and the plasma etching is performed for 30 s to 3 min.

10. The method for preparing a carbon nanotube thin membrane provided with opening and growing vertically according to claim 1, wherein in step (7), the concentration of the nitric acid solution is 1-4 mol/L; a heating and refluxing time is 1-3 h; a heating and refluxing temperature is 50-65° C.; and a condition for drying in the oven is drying for at least 24 h at a temperature of 60-70° C.

* * * * *